(12) United States Patent
Nomaru et al.

(10) Patent No.: US 10,940,560 B2
(45) Date of Patent: Mar. 9, 2021

(54) LASER PROCESSING APPARATUS

(71) Applicant: DISCO CORPORATION, Tokyo (JP)

(72) Inventors: Keiji Nomaru, Tokyo (JP); Yuji Hadano, Tokyo (JP); Masatoshi Nayuki, Tokyo (JP)

(73) Assignee: DISCO CORPORATION, Tokyo (JP)

(*) Notice: Subject to any disclaimer, the term of this patent is extended or adjusted under 35 U.S.C. 154(b) by 390 days.

(21) Appl. No.: 16/172,959

(22) Filed: Oct. 29, 2018

(65) Prior Publication Data

US 2019/0126397 A1 May 2, 2019

(30) Foreign Application Priority Data

Oct. 31, 2017 (JP) .............................. JP2017-210657

(51) Int. Cl.
*B23K 26/142* (2014.01)
*H01L 21/687* (2006.01)
(Continued)

(52) U.S. Cl.
CPC .......... *B23K 26/142* (2015.10); *B23K 26/046* (2013.01); *B23K 26/0665* (2013.01); *B23K 26/083* (2013.01); *B23K 26/0821* (2015.10); *B23K 26/0823* (2013.01); *B23K 26/1224* (2015.10); *B23K 26/146* (2015.10); *B23K 26/359* (2015.10); *B23K 26/364* (2015.10); *B23K 26/38* (2013.01); *H01L 21/6715* (2013.01); *H01L 21/67051* (2013.01); *H01L 21/67092* (2013.01); *H01L 21/68764* (2013.01); *H01L 21/68785* (2013.01);
(Continued)

(58) Field of Classification Search
CPC .................................................. B23K 26/122
See application file for complete search history.

(56) References Cited

U.S. PATENT DOCUMENTS 4,681,774 A * 7/1987 Halliwell ............... H05K 3/185
427/306
6,110,282 A * 8/2000 Tateyama .............. B05C 5/0254
118/712
(Continued)

FOREIGN PATENT DOCUMENTS

JP 10305420 A 11/1998
JP 2002192370 A 7/2002
(Continued)

*Primary Examiner* — Ibrahime A Abraham
*Assistant Examiner* — John J Norton
(74) *Attorney, Agent, or Firm* — Greer Burns & Crain Ltd.

(57) ABSTRACT

A liquid supply mechanism is disposed on an upper portion of a holding unit of a laser processing apparatus. The liquid supply mechanism includes: a liquid chamber having a transparent plate positioned such that a gap is formed between the transparent plate and the top surface of a workpiece held on a holding table; a linear-motion mechanism configured to linearly move the transparent plate over the liquid chamber; a liquid supply nozzle configured to supply a liquid from one side of the liquid chamber to the gap; and a liquid discharge nozzle configured to discharge the liquid from another side of the liquid chamber. A laser beam irradiating unit includes a laser oscillator configured to irradiate the workpiece through the transparent plate and the liquid supplied to the gap.

2 Claims, 6 Drawing Sheets

(51) Int. Cl.
*B23K 26/08* (2014.01)
*B23K 26/359* (2014.01)
*B23K 26/122* (2014.01)
*H01L 21/67* (2006.01)
*B23K 26/146* (2014.01)
*B23K 26/364* (2014.01)
*B23K 26/38* (2014.01)
*H01L 21/82* (2006.01)
*B23K 26/06* (2014.01)
*B23K 26/046* (2014.01)
*B23K 26/12* (2014.01)
*B23K 26/082* (2014.01)
*B23K 103/00* (2006.01)
*B23K 101/40* (2006.01)

(52) U.S. Cl.
CPC .......... *H01L 21/82* (2013.01); *B23K 2101/40* (2018.08); *B23K 2103/56* (2018.08)

(56) References Cited

U.S. PATENT DOCUMENTS 6,544,590 B1* 4/2003 Kodera ................ B05C 5/0208
118/428

2002/0136971 A1* 9/2002 Ito .......................... B23K 26/04
430/22
2005/0219488 A1* 10/2005 Nei ......................... G03F 7/707
355/53
2006/0077367 A1* 4/2006 Kobayashi ................ G03F 7/00
355/53
2007/0085990 A1* 4/2007 Chibana .............. G03F 7/70341
355/53
2007/0127006 A1* 6/2007 Shibazaki ........... G03F 7/70341
355/72
2007/0269294 A1* 11/2007 Nagasaka ........... H01L 21/6715
414/217.1
2008/0002163 A1* 1/2008 Fujiwara ............. G03F 7/70733
355/30
2011/0192450 A1* 8/2011 Liu ..................... H01L 31/0296
136/252

FOREIGN PATENT DOCUMENTS

JP      2004188475 A    7/2004
JP      2014221483 A   11/2014

* cited by examiner

LASER PROCESSING APPARATUS

BACKGROUND OF THE INVENTION

Field of the Invention

The present invention relates to a laser processing apparatus that processes a plate-shaped workpiece by irradiating the workpiece with a laser beam.

Description of the Related Art

A wafer having a plurality of devices such as integrated circuits (ICs), large scale integrated circuits (LSIs), or the like demarcated by planned dividing lines and formed on a top surface thereof is divided into individual device chips by a laser processing apparatus. The divided device chips are used in electric apparatuses such as mobile telephones, personal computers, lighting apparatuses, or the like.

There are laser processing apparatuses of the following types: a type of laser processing apparatus that forms a groove as a starting point of division by ablation processing, in which a top surface of a workpiece is irradiated with a laser beam having a wavelength absorbable by the workpiece while a condensing point of the laser beam is positioned at the top surface of the workpiece (see for example Japanese Patent Laid-Open No. Hei 10-305420); a type of laser processing apparatus that forms a modified layer as a starting point of division within a workpiece by irradiating the inside of the workpiece with a laser beam having a wavelength transmissible through the workpiece while positioning a condensing point of the laser beam within the workpiece (see for example Japanese Patent No. 3408805); and a type of laser processing apparatus that forms a plurality of shield tunnels extended from a top surface to an undersurface of a workpiece and constituted of a thin hole as a starting point of division and an amorphous region surrounding the thin hole by irradiating a desired position of the workpiece with a laser beam having a wavelength transmissible through the workpiece while positioning a condensing point of the laser beam at the desired position of the workpiece (see for example Japanese Patent Laid-Open No. 2014-221483). A laser processing apparatus is selected as appropriate according to the kind of a workpiece, processing accuracy, or the like.

In the type of laser processing apparatus that performs ablation processing, in particular, among the laser processing apparatuses described above, debris (laser processing waste) occurring when the top surface of the wafer is irradiated with the laser beam scatters and adheres to the top surfaces of devices formed on the wafer and may degrade the quality of the devices. Thus, a technology has been proposed which coats the top surface of a wafer with a liquid resin that transmits a laser beam used for laser processing before the processing is performed, to prevent the adhesion of debris, and removes the liquid resin after performing the laser processing (see for example Japanese Patent Laid-Open No. 2004-188475).

SUMMARY OF THE INVENTION

According to the technology described in Japanese Patent Laid-Open No. 2004-188475, the top surface of the wafer is coated with a liquid resin. Thus, debris can be prevented from adhering to the top surface of the devices, so that processing quality is ensured. However, there is a problem in productivity because of needs of a process of applying the liquid resin and a process of removing the liquid resin after the processing. Further, there is also a problem of poor economy because the liquid resin cannot be used repeatedly.

Another technology has also been proposed which prevents adhesion of debris to the top surface of a wafer by irradiating the wafer with a laser beam in a state in which the wafer is submerged and thus making the debris float in the water. However, in the case where the wafer is irradiated with a laser beam in the state in which the wafer is submerged, minute bubbles (air bubbles) occur from a region of the wafer which region is irradiated with the laser beam, so that the air bubbles hinder the advance of the laser beam. Therefore desired processing cannot be performed.

It is accordingly an object of the present invention to provide a laser processing apparatus in which the irradiation of a plate-shaped workpiece with a laser beam is not hindered when the workpiece is processed by irradiating the workpiece with the laser beam.

In accordance with an aspect of the present invention, there is provided a laser processing apparatus including: a holding unit including a holding table configured to hold a plate-shaped workpiece; a laser beam irradiating unit configured to process the workpiece held on the holding table by irradiating the workpiece with a laser beam; and a liquid supply mechanism disposed on an upper portion of the holding unit; the liquid supply mechanism including a liquid chamber having a transparent plate positioned such that a gap is formed between the transparent plate and a top surface of the workpiece held on the holding table, a linear-motion mechanism configured to linearly move the transparent plate over the liquid chamber, a liquid supply nozzle configured to supply a liquid from one side of the liquid chamber to the gap, and a liquid discharge nozzle configured to discharge the liquid from another side of the liquid chamber, and the laser beam irradiating unit including a laser oscillator configured to emit the laser beam and a condenser configured to condense the laser beam emitted from the laser oscillator and irradiate the workpiece held on the holding table with the laser beam through the transparent plate and the liquid supplied to the gap.

Preferably, the laser beam irradiating unit further includes dispersing means dispersing the laser beam emitted from the laser oscillator.

According to the present invention, a laser processing apparatus is provided in which the irradiation of a workpiece with a laser beam is not hindered. In addition, when the present invention is applied to a laser processing apparatus that performs ablation processing, adhesion of debris occurring at a time of laser processing to devices can be suppressed without the top surface of a wafer being coated with a liquid resin. Therefore a decrease in processing quality of the devices is prevented.

The above and other objects, features and advantages of the present invention and the manner of realizing them will become more apparent, and the invention itself will best be understood from a study of the following description and appended claims with reference to the attached drawings showing some preferred embodiments of the invention.

DETAILED DESCRIPTION OF THE PREFERRED EMBODIMENTS

Figure 1:
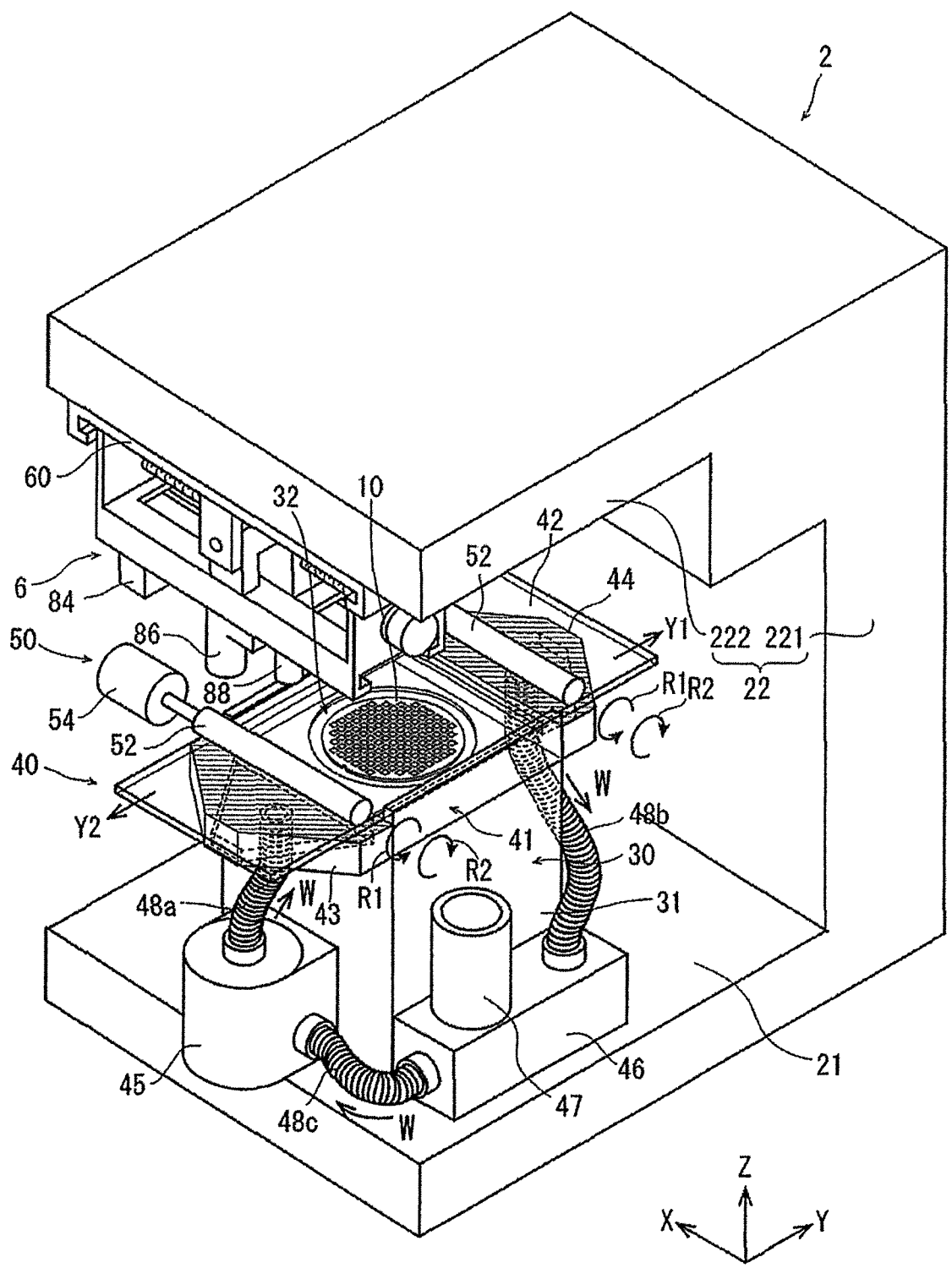
FIG. 1 is a perspective view of a laser processing apparatus according to an embodiment of the present invention.

A laser processing apparatus according to embodiments based on the present invention will hereinafter be described in further detail with reference to the accompanying drawings. FIG. 1 is a perspective view of a laser processing apparatus 2 according to the present embodiment. The laser processing apparatus 2 includes: a base 21; a holding unit 30 that is disposed on the base 21 and holds a workpiece; a frame body 22 constituted of a vertical wall portion 221 erected in a Z-direction indicated by an arrow Z on a side of the holding unit 30 on the base 21 and a horizontal wall portion 222 extending in a horizontal direction from an upper end portion of the vertical wall portion 221; a liquid supply mechanism 40 arranged on an upper portion of the holding unit 30; and a laser beam irradiating unit 6 arranged on an undersurface of the horizontal wall portion 222.

Figure 2:
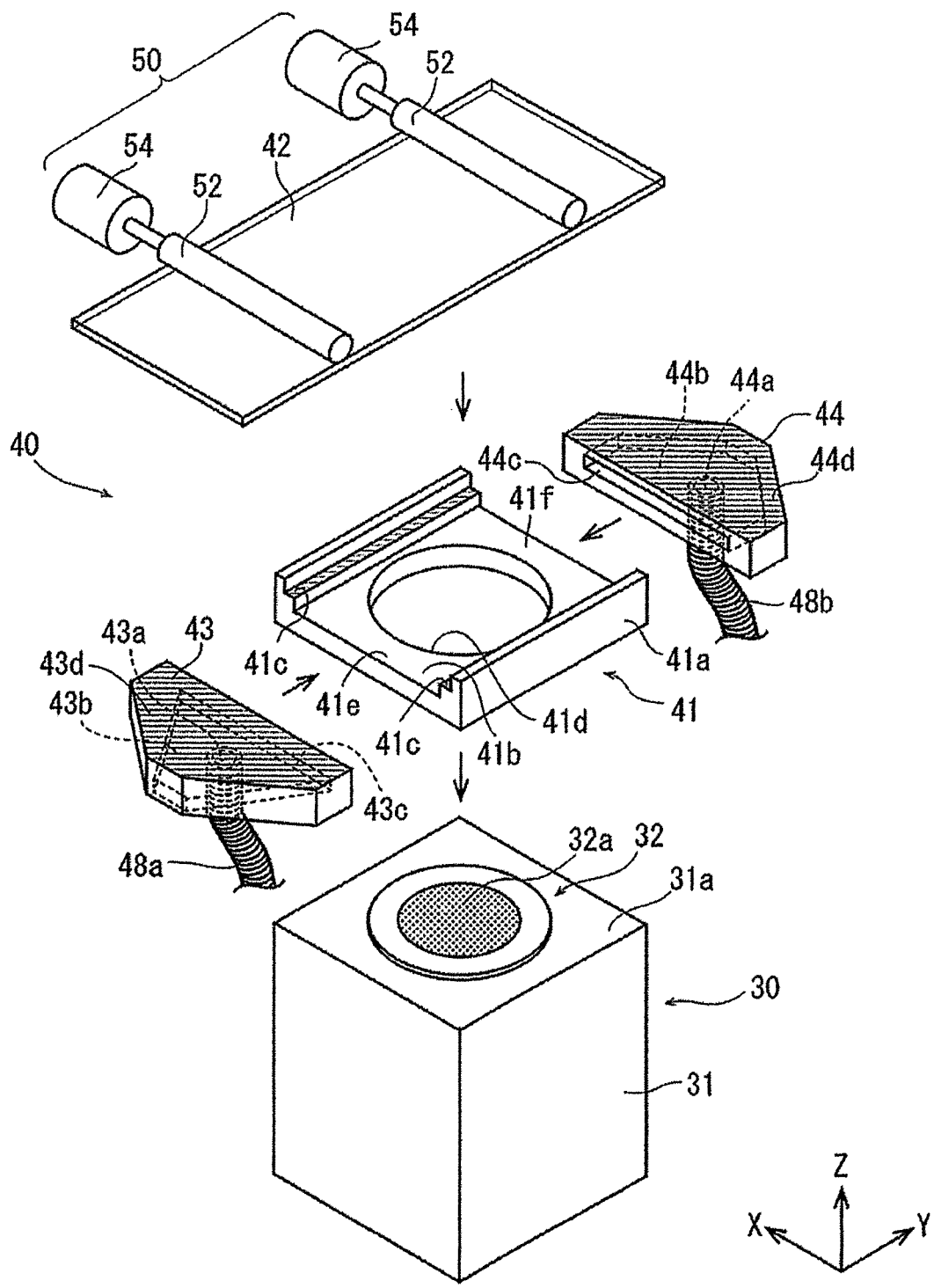
FIG. 2 is an exploded perspective view depicting, in a disassembled state, a part of a liquid chamber and a holding unit constituting a liquid supply mechanism of the laser processing apparatus depicted in FIG. 1.

FIG. 2 is an exploded view depicting, in a disassembled state, the respective configurations of the holding unit 30 and a liquid chamber 41, a liquid supply nozzle 43, and a liquid discharge nozzle 44 constituting the liquid supply mechanism 40. The respective configurations will be described in the following.

As depicted in FIG. 2, the holding unit 30 includes a rectangular parallelepipedic holding base 31 fixed on the base 21 and a circular holding table 32 disposed on a top surface 31a of the holding base 31. The holding table 32 is configured to be rotatable by a rotating mechanism that is not depicted. A central region of the holding table 32 is constituted of a circular suction chuck 32a formed by a material having air permeability, for example porous ceramic. The suction chuck 32a is connected to a suction source that is not depicted, and sucks and holds a plate-shaped workpiece mounted on the suction chuck 32a.

The liquid supply mechanism 40 depicted in FIG. 2 is disposed on the upper portion of the holding unit 30. Specifically, the liquid chamber 41 constituting the liquid supply mechanism 40 is mounted and fixed on the top surface 31a of the holding base 31. The liquid chamber 41 has a plate-shaped chamber base portion 41a and a transparent plate 42 having a rectangular shape as viewed in plan which the transparent plate 42 closes an upper part of the chamber base portion 41a. The transparent plate 42 is formed by a transparent member transmitting a laser beam LB to be described later, the transparent member being for example glass. The chamber base portion 41a includes a bottom portion 41b forming a rectangular shape as viewed in plan and stepped portions 41c formed along a Y-axis direction at both end portions in an X-axis direction of the bottom portion 41b. A vertically penetrating circular opening portion 41d formed in a size slightly larger than the holding table 32 is formed in a center of the bottom portion 41b. The circular opening portion 41d is set such that the holding table 32 is positioned in the circular opening portion 41d when the chamber base portion 41a is installed on the holding base 31. A dimension between the stepped portions 41c is a dimension slightly larger than a dimension in the X-axis direction of the transparent plate 42.

When the transparent plate 42 is mounted on the stepped portions 41c, the transparent plate 42 closes the upper part of the chamber base portion 41a, and a predetermined space is formed between the bottom portion 41b and the transparent plate 42. In addition, movement in the X-axis direction of the transparent plate 42 mounted on the stepped portions 41c is regulated by the stepped portions 41c, and movement in the Y-axis direction of the transparent plate 42 is guided by the stepped portions 41c. Fluorine coating is applied to surfaces of the stepped portions 41c to be able to reduce frictional resistance when the transparent plate 42 slides on the stepped portions 41c, and also to prevent wear or the like. No stepped portion as described above is formed at both end portions in the Y-axis direction of the bottom portion 41b of the chamber base portion 41a, and a liquid supply port 41e supplied with a liquid in the Y-axis direction and a liquid discharge port 41f from which the liquid is discharged are formed when the transparent plate 42 is mounted. Incidentally, the transparent plate 42 is formed by a glass plate in the present embodiment. However, the transparent plate 42 is not limited to this. It suffices for the transparent plate 42 to be a transparent plate transmitting the laser beam LB, and the transparent plate 42 may for example be a plate made of a resin such as acrylic or the like.

The liquid supply nozzle 43 for supplying a liquid to the liquid chamber 41 is coupled to the liquid supply port 41e of the chamber base portion 41a. In addition, the liquid discharge nozzle 44 for discharging the liquid from the liquid chamber 41 is coupled to the liquid discharge port 41f of the chamber base portion 41a.

The liquid supply nozzle 43 includes: a supply port 43a supplied with the liquid; a passage 43b through which the liquid supplied from the supply port 43a passes; and a discharge port 43c from which the liquid passed through the passage 43b is discharged. In addition, fluorine coating is applied to a top surface 43d of the liquid supply nozzle 43. As indicated by dotted lines in FIG. 2, the supply port 43a is disposed in an undersurface of the liquid supply nozzle 43, the passage 43b is formed within the liquid supply nozzle 43, and the discharge port 43c is formed at a position opposed to the liquid supply port 41e of the liquid chamber 41. When the liquid supply nozzle 43 is coupled to the liquid chamber 41, the discharge port 43c of the liquid supply nozzle 43 and the liquid supply port 41e of the liquid chamber 41 communicate with each other.

The liquid discharge nozzle 44 is configured in the same shape as the liquid supply nozzle 43. As depicted in FIG. 2, the liquid discharge nozzle 44 includes: a supply port 44c supplied with the liquid; a passage 44b through which the liquid supplied from the supply port 44c passes; and a discharge port 44a from which the liquid passed through the passage 44b is discharged. As with the liquid supply nozzle 43, fluorine coating is applied to a top surface 44d of the liquid discharge nozzle 44. Incidentally, in FIG. 2, the parts to which fluorine coating is applied are hatched. As indicated by dotted lines in FIG. 2, the supply port 44c of the liquid discharge nozzle 44 is formed at a position opposed to the liquid discharge port 41f of the liquid chamber 41, the passage 44b is formed within the liquid discharge nozzle 44, and the discharge port 44a is disposed in an undersurface of the liquid discharge nozzle 44.

When the liquid supply nozzle 43 and the liquid discharge nozzle 44 are coupled to the liquid chamber 41, the supply port 43a of the liquid supply nozzle 43 and the discharge port 44a of the liquid discharge nozzle 44 communicate with each other via the liquid chamber 41. In addition, when the liquid supply nozzle 43 and the liquid discharge nozzle 44 are coupled to the liquid chamber 41, the stepped portions 41c of the liquid chamber 41, the top surface 43d of the liquid supply nozzle 43, and a top surface portion 44d of the liquid discharge nozzle 44 are set at a same height.

The transparent plate 42 has a rectangular shape as described above. A dimension in the Y-axis direction of the transparent plate 42 is set larger than a total dimension in the Y-axis direction of the liquid supply nozzle 43, the liquid chamber 41, and the liquid discharge nozzle 44 in a coupled state. In addition, a dimension in the X-axis direction of the transparent plate 42 is set at least larger than a dimension in the X-axis direction of the workpiece held on the holding table 32, and is preferably set larger than the diameter of the holding table 32. When thus formed, the transparent plate 42 can cover the whole of the holding table 32 from above.

The liquid supply mechanism 40 according to the present embodiment has linear-motion means 50 linearly moving the transparent plate 42 over the liquid chamber 41 along the Y-axis direction. The linear-motion means 50 includes two rollers 52 and motors 54 that rotation-drive the respective rollers 52. The two rollers 52 are arranged in parallel with each other along the X-axis direction at a predetermined interval in the Y-axis direction, for example an interval larger than a dimension in the Y-axis direction of the liquid chamber 41. The surfaces of the rollers 52 are preferably formed of a material having elasticity and not easily slipping on the transparent plate 42, the material being urethane rubber or the like. In addition, preferably, one end portions of the rollers 52 are connected to output shafts of the motors 54, and other end portions of the rollers 52 are rotatably supported by a fixing portion that is not depicted. The two rollers 52 in an installed state press the transparent plate 42 and can be moved linearly in the Y-axis direction by rotating the output shafts of the two motors 54 in a same direction. Incidentally, the motors 54 are not necessarily limited to being provided to the two rollers 52, but the rollers 52 may be rotation-driven simultaneously by connecting one motor to only one roller 52, and coupling the one roller 52 to the other roller 52 by a belt or the like. In addition, the number, dimensions, arrangement positions, and the like of the rollers 52 are not limited to the mode of the present embodiment, but can be changed as appropriate according to the material, dimensions, or the like of the transparent plate 42.

Figure 3:
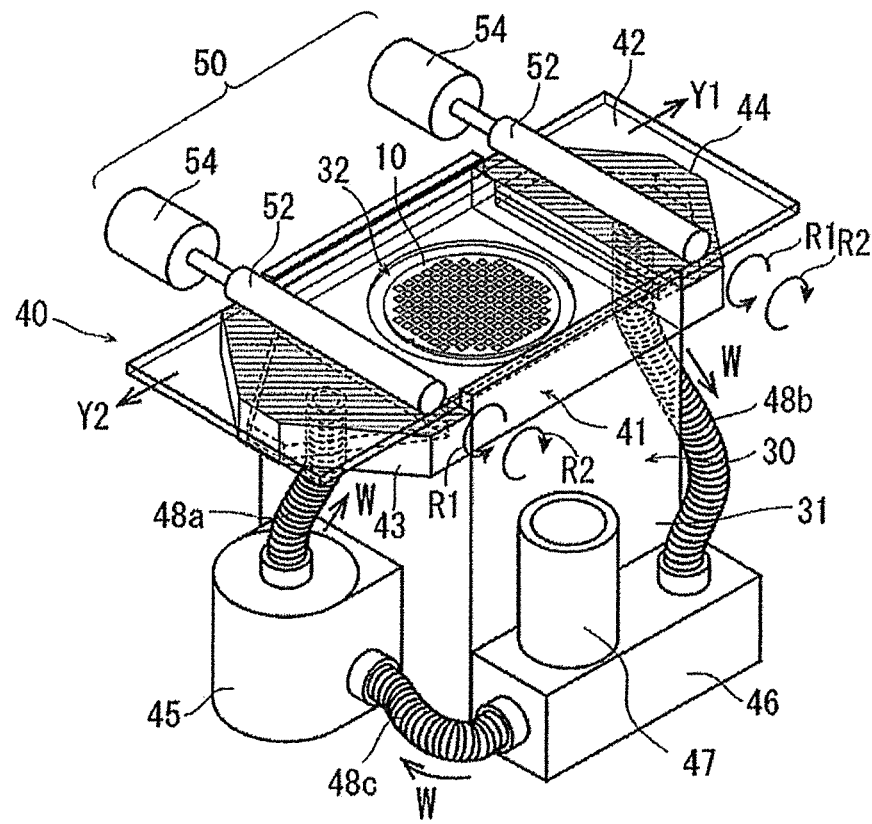
FIG. 3 is a perspective view explaining operation of the liquid supply mechanism and the holding unit depicted in FIG. 2.

The liquid supply mechanism 40 and a peripheral configuration of the liquid supply mechanism 40 will be further described with reference to FIG. 3, which depicts a state in which the liquid supply mechanism 40 depicted in FIG. 2 is assembled to the upper portion of the holding unit 30. FIG. 3 depicts a state in which the holding table 32 sucks and holds a wafer 10 having devices formed on a top surface thereof as a plate-shaped workpiece. When the liquid chamber 41 is mounted on the top surface 31a of the holding base 31, the circular opening portion 41d of the chamber base portion 41a is positioned above the holding table 32. Then, the top surface of the wafer 10 sucked and held by the holding table 32 is exposed in the circular opening portion 41d, and becomes substantially flush with the bottom portion 41b of the liquid chamber 41. The laser processing apparatus 2 according to the present embodiment includes a liquid supply pump 45, a filtration filter 46, and a liquid storage tank 47 so that the liquid circulates within the liquid supply mechanism 40 at all times. The liquid storage tank 47 is disposed directly on the filtration filter 46. The liquid supply pump 45 and the liquid supply nozzle 43 are connected to each other by a first hose 48a. The liquid discharge nozzle 44 and the filtration filter 46 are connected to each other by a second hose 48b. The filtration filter 46 and the liquid supply pump 45 are connected to each other by a third hose 48c. The hoses 48a to 48c are each formed by a flexible hose made of a resin.

The liquid W through which the laser beam LB passes, the liquid W being for example pure water, is discharged from the liquid supply pump 45. The liquid W is supplied to the liquid chamber 41 via the first hose 48a and the liquid supply nozzle 43. The liquid W supplied to the liquid chamber 41 passes between the transparent plate 42 and the top surface of the wafer 10, and is discharged via the liquid discharge nozzle 44. Then, the liquid W discharged from the liquid discharge nozzle 44 is guided to the filtration filter 46 to be filtered, and then returned to the liquid supply pump 45. In the liquid supply mechanism 40 according to the present embodiment, the liquid W is allowed to leak out gradually from a gap between the chamber base portion 41a of the liquid chamber 41 and the transparent plate 42 or the like. The liquid W that has leaked out may be collected by a collection path, not depicted, on the base 21, and returned to the filtration filter 46. In addition, when the liquid W is reduced due to the above-described leakage, it suffices to fill the liquid W from the liquid storage tank 47 as appropriate. Incidentally, the liquid storage tank 47 is directly connected to the filtration filter 46, and has a function of discharging air bubbles included in the liquid W guided to the filtration filter 46.

The configuration as described above circulates the liquid W in the liquid supply mechanism 40, the liquid supply pump 45, the filtration filter 46, and the liquid storage tank 47. The flow rate of the liquid W flowing in the liquid chamber 41 can be adjusted by adjusting the pumping efficiency of the liquid supply pump 45, changing the capacity of the liquid chamber 41, or adjusting the opening areas of the liquid supply port 41e and the liquid discharge port 41f. The flow rate of the liquid W flowing in the liquid chamber 41 is adjusted to be a predetermined flow rate.

As described above, the motors 54 are coupled to the rollers 52, and the transparent plate 42 can be moved linearly in the Y-axis direction over the liquid chamber 41 by rotating the motors 54. In particular, in the present embodiment, control means not depicted of the laser processing apparatus 2 can switch the direction of rotation of the motors 54 to a normal rotation direction indicated by an arrow R1 in FIG. 3 and a reverse rotation direction indicated by an arrow R2. The transparent plate 42 is moved in a direction indicated by an arrow Y1 by rotating the motors 54 in the normal rotation direction R1. In addition, the transparent plate 42 is moved in a direction indicated by an arrow Y2 by rotating the motors 54 in the reverse rotation direction R2.

The laser beam irradiating unit 6 will next be described with reference to FIG. 1, FIG. 4, and FIG. 5. Incidentally, FIG. 5 is an exploded perspective view of the laser beam irradiating unit 6 depicted in FIG. 4.

The laser beam irradiating unit 6 includes: a guide plate 60 fixed to the undersurface of the horizontal wall portion 222 of the frame body 22 by fixing means not depicted; a Y-axis direction movable member 62 supported movably in the Y-axis direction by the guide plate 60; and a Y-axis direction moving mechanism 64 that moves the Y-axis direction movable member 62 in the Y-axis direction. A pair of guide rails 60a extending in the Y-axis direction is formed at both X-axis direction lower end portions of the guide plate 60. As depicted in FIG. 4 and FIG. 5, the Y-axis direction movable member 62 includes a pair of guided portions 66 arranged at an interval in the X-axis direction and a mounting portion 68 stretched between lower ends of the guided portions 66 and extending in the X-axis direction. Guided rails 66a extending in the Y-axis direction are formed on upper portions of the respective guided portions 66. The guided rails 66a of the guided portions 66 engage with the guide rails 60a of the guide plate 60, and thereby the Y-axis direction movable member 62 is supported movably in the Y-axis direction by the guide plate 60. In addition, a pair of guide rails 68a extending in the X-axis direction is formed at both Y-axis direction lower end portions of the mounting portion 68. The Y-axis direction moving mechanism 64 includes a ball screw 70 extending in the Y-axis direction below the guide plate 60 and a motor 72 coupled to one end portion of the ball screw 70. A gate-shaped nut portion 70a of the ball screw 70 is fixed to a top surface of the mounting portion 68. Another end portion of the ball screw 70 to which end portion the motor 72 is not coupled is screwed into the nut portion 70a, and thereafter rotatably supported by a supporting piece portion 60b formed at a front edge portion of the guide plate 60. Then, the Y-axis direction moving mechanism 64 converts a rotary motion of the motor 72 into a rectilinear motion by the ball screw 70, and transmits the rectilinear motion to the Y-axis direction movable member 62. The Y-axis direction moving mechanism 64 thereby moves the Y-axis direction movable member 62 in the Y-axis direction along the guide rails 60a of the guide plate 60.

Figure 5:
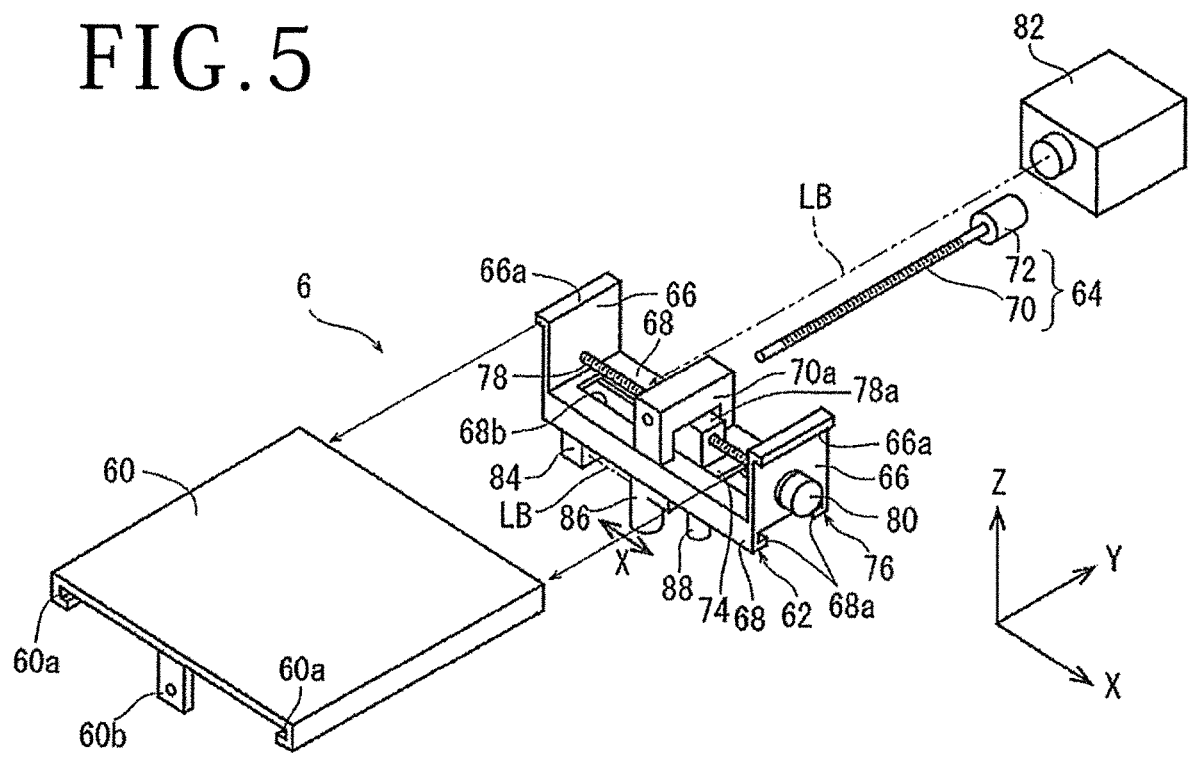
FIG. 5 is an exploded perspective view of the laser beam irradiating unit depicted in FIG. 4.

The description of the laser beam irradiating unit 6 will be continued with reference to FIG. 5. The laser beam irradiating unit 6 further includes: an X-axis direction movable plate 74 mounted in the mounting portion 68 of the Y-axis direction movable member 62 so as to be movable in the X-axis direction; and an X-axis direction moving mechanism 76 that moves the X-axis direction movable plate 74 in the X-axis direction. Both Y-axis direction end portions of the X-axis direction movable plate 74 are engaged with the guide rails 68a of the mounting portion 68, and thereby the X-axis direction movable plate 74 is mounted in the mounting portion 68 so as to be movable in the X-axis direction. The X-axis direction moving mechanism 76 includes a ball screw 78 extending in the X-axis direction above the mounting portion 68 and a motor 80 coupled to one end portion of the ball screw 78 and supported by one of the guided portions 66. A nut portion 78a of the ball screw 78 is fixed to a top surface of the X-axis direction movable plate 74 through an opening 68b of the mounting portion 68. Another end portion of the ball screw 78 to which end portion the motor 80 is not coupled is rotatably supported by the other guided portion 66 to which the motor 80 is not fixed. Then, the X-axis direction moving mechanism 76 converts a rotary motion of the motor 80 into a rectilinear motion by the ball screw 78, and transmits the rectilinear motion to the X-axis direction movable plate 74. The X-axis direction moving mechanism 76 thereby moves the X-axis direction movable plate 74 in the X-direction along the guide rails 68a of the mounting portion 68.

Figure 6:
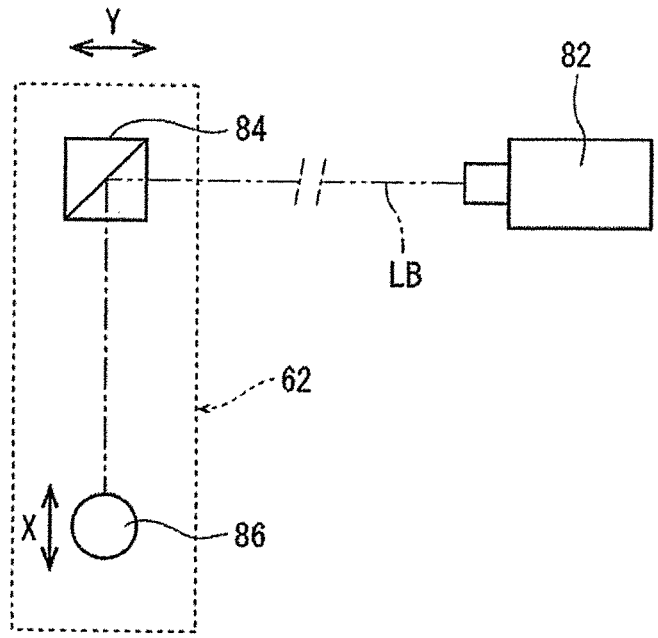
FIG. 6 is a block diagram depicting an outline of an optical system of the laser beam irradiating unit depicted in FIG. 4.

Referring to FIGS. 5 to 8, further description will be made of a configuration of an optical system of the laser beam irradiating unit 6. As depicted in FIG. 5, the laser beam irradiating unit 6 includes: a laser oscillator 82 that is included in the horizontal wall portion 222 of the frame body 22 and emits a pulsed laser beam LB; an attenuator (not depicted) that adjusts the power of the laser beam LB emitted from the laser oscillator 82; a right-angle prism mirror 84 fitted to an undersurface of the mounting portion 68 of the Y-axis direction movable member 62 at an interval from the laser oscillator 82 in the Y-axis direction; a condenser 86 fitted to an undersurface of the X-axis direction movable plate 74 so as to be movable in a Z-axis direction; and condensing point position adjusting means (not depicted) that adjusts the position of a condensing point of the condenser 86 in the Z-axis direction by moving the condenser 86 in the Z-axis direction. The laser oscillator 82 for example oscillates a laser of a wavelength (for example 355 nm) absorbable by the workpiece. As depicted in FIG. 6, the traveling direction of the laser beam LB applied from the laser oscillator 82 in the Y-axis direction is changed by 90 degrees by the right-angle prism mirror 84, and the laser beam LB is guided to the condenser 86.

Figure 7A:
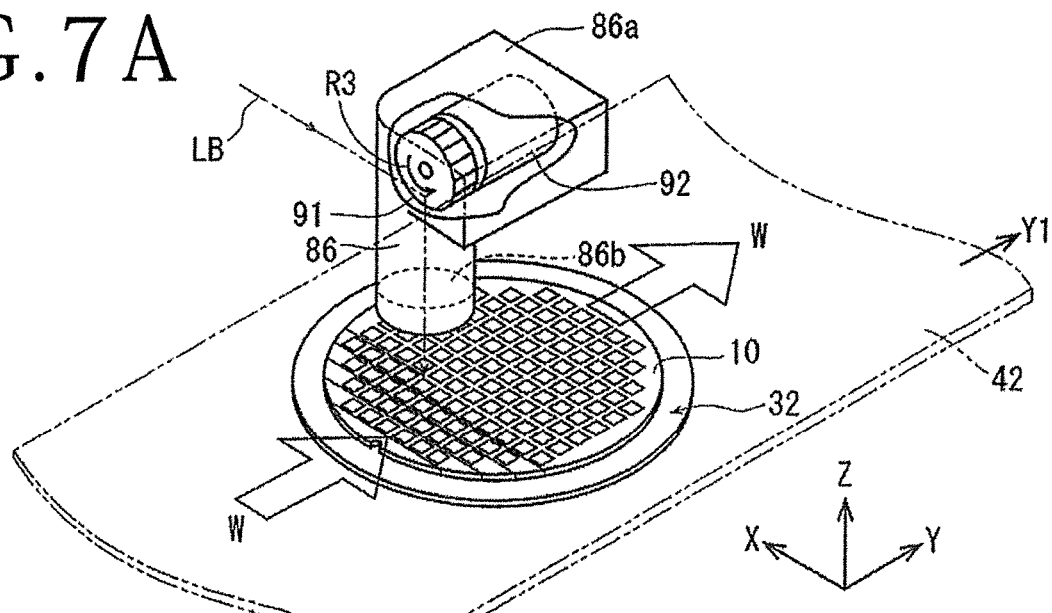
FIG. 7A is a perspective view depicting a state in which laser processing is performed by the laser beam irradiating unit depicted in FIG. 5.
Figure 7B:
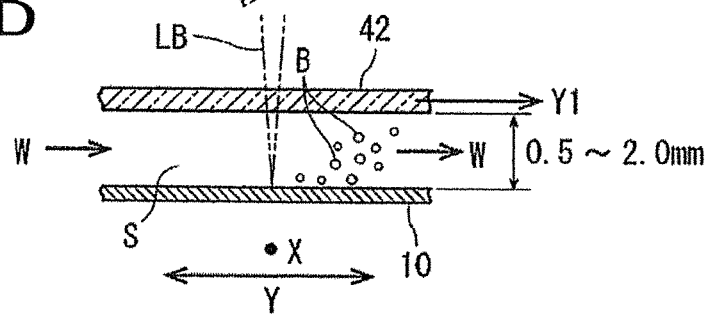
FIG. 7B is a partial enlarged sectional view of FIG. 7A.
Figure 8:
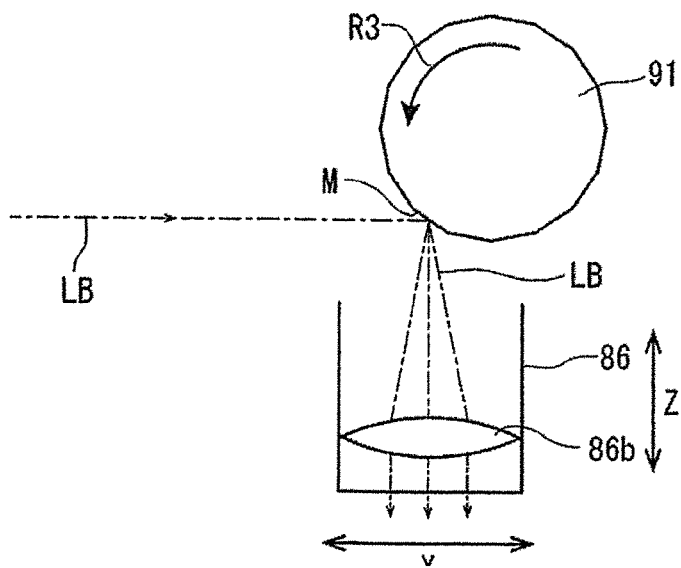
FIG. 8 is a side view of the laser beam irradiating unit, FIG. 8 explaining the state in which the laser processing depicted in FIGS. 7A and 7B is performed.

As depicted in FIG. 7A, the inside of an upper housing 86a of the condenser 86 includes a polygon mirror 91 as dispersing means dispersing the laser beam LB oscillated by the laser oscillator 82 and a motor 92 that rotates the polygon mirror 91 in a direction indicated by an arrow R3 at high speed, as depicted with a part of the upper housing 86a cut away, as well as a condensing lens (fθ lens) 86b that condenses the laser beam LB and irradiates the workpiece with the condensed laser beam LB. The laser beam LB applied from the condenser 86 is applied to a planned dividing line as a region to be processed of the wafer 10 via the transparent plate 42 and the liquid W. As is understood from a partial enlarged sectional view depicted in FIG. 7B, a gap S of 0.5 to 2.0 mm is formed between the transparent plate 42 and the wafer 10. As depicted in FIG. 8, the polygon mirror 91 has a plurality of mirrors M arranged concentrically about the axis of rotation of the polygon mirror 91. The fθ lens 86b is located below the polygon mirror 91 described above. The fθ lens 86b condenses the laser beam LB, and irradiates the workpiece on the holding table 32 with the condensed laser beam LB. The laser beam LB guided from the right-angle prism mirror 84 is guided to the fθ lens by the rotating mirrors M such that the irradiation direction of the laser beam LB is dispersed in the X-axis direction. The laser beam LB is thus applied so as to be dispersed in a predetermined range in the X-axis direction on the workpiece.

Returning to FIG. 5 and continuing the description, an alignment unit 88 is disposed on the undersurface of the X-axis direction movable plate 74 together with the condenser 86, the alignment unit 88 being fitted to the undersurface of the X-axis direction movable plate 74 at an interval from the condenser 86 in the X-axis direction. The alignment unit 88 images the workpiece held on the holding table 32, and detects a region to be laser-processed. Further, the laser beam irradiating unit 6 includes the condensing point position adjusting means not depicted in the figure. Though a concrete configuration of the condensing point position adjusting means is not depicted, the condensing point position adjusting means may for example have a configuration including a ball screw whose nut portion is fixed to the condenser 86 and which extends in the Z-axis direction and a motor coupled to one end portion of the ball screw. Such a configuration converts a rotary motion of the motor into a rectilinear motion, and moves the condenser 86 along guide rails (not depicted) arranged in the Z-axis direction. The position in the Z-axis direction of the condensing point of the laser beam LB condensed by the condenser 86 is thereby adjusted.

The laser processing apparatus 2 according to the present invention has substantially the configuration as described above. Action of the laser processing apparatus 2 according to the present invention will be described in the following. The description will be made with reference to FIG. 1. First, a wafer 10 formed of silicon (Si) having devices formed on a top surface thereof is prepared, the wafer 10 being a plate-shaped workpiece in the present embodiment. After the wafer 10 is prepared, the transparent plate 42 depicted in FIG. 1 is removed to open the upper part of the liquid chamber 41, and the wafer 10 is mounted on the holding table 32 such that the top surface on which the devices are formed is directed upward. After the wafer 10 is mounted, a suction force is generated in the suction chuck 32a of the holding table 32 by actuating a suction source not depicted, so that the wafer 10 is sucked and held on the suction chuck 32a. After the wafer 10 is held on the holding table 32, the transparent plate 42 is set over the liquid chamber 41 again to set the top of the liquid chamber 41 in a closed state.

After the wafer 10 is held on the holding table 32 and the upper part of the liquid chamber 41 is closed by the transparent plate 42, the liquid storage tank 47 is filled with a sufficient liquid W, and the liquid supply pump 45 is actuated. When a predetermined time has passed since a start of the actuation of the liquid supply pump 45, air or the like is removed from the liquid chamber 41, the inside of the liquid chamber 41 is filled with the liquid W, and the liquid W stably circulates within the liquid supply mechanism 40.

Figure 4:
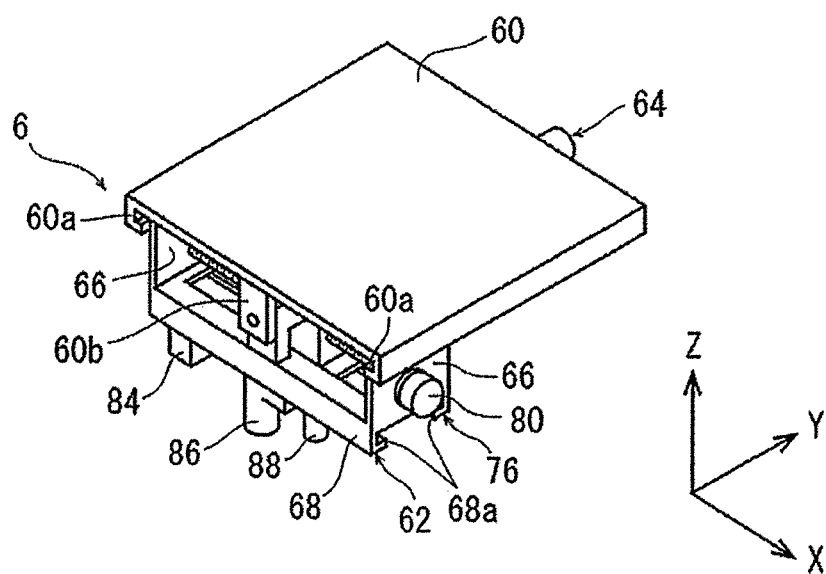
FIG. 4 is a perspective view of a laser beam irradiating unit of the laser processing apparatus depicted in FIG. 1.

In a state in which the liquid W stably circulates within the liquid supply mechanism 40, the alignment unit 88 is positioned above the wafer 10 by moving the X-axis direction movable plate 74 by the X-axis direction moving mechanism 76 of the laser beam irradiating unit 6 and moving the Y-axis direction movable member 62 in the Y-axis direction by the Y-axis direction moving mechanism 64 (see FIG. 4 and FIG. 5). Because the transparent plate 42 is disposed so as to cover the whole of the holding table 32 from above, as described above, the alignment unit 88 can capture an entire region including the devices on the wafer 10. After the alignment unit 88 is positioned above the wafer 10, the alignment unit 88 images the wafer 10. At this time, the wafer 10 is imaged via the transparent plate 42 and the liquid W. Next, the wafer 10 and the condenser 86 are aligned with each other on the basis of image information on the wafer 10 imaged by the alignment unit 88. After the alignment, the holding table 32 is rotated, and the X-axis direction moving mechanism 76 moves the X-axis direction movable plate 74 and the Y-axis direction moving mechanism 64 moves the Y-axis direction movable member 62, so that planned dividing lines formed in a lattice manner on the wafer 10 are positioned along the X-axis direction, and the condenser 86 is positioned at one end portion of a planned dividing line, that is, a start position of irradiation with the laser beam. Next, the condensing point is positioned at a top surface height of the one end portion in the planned dividing line of the wafer 10 by moving the condenser 86 in the Z-axis direction by the condensing point position adjusting means not depicted.

After the condensing point position is positioned at the top surface height of the wafer 10 by moving the condenser 86 in the Z-axis direction, the transparent plate 42 is moved to an initial position before a start of laser processing. The initial position of the transparent plate 42 is specifically a position to which the transparent plate 42 is moved farthest in a Y2 direction indicated by an arrow Y2, and for example represents a state in which an end portion of the transparent plate 42 is located directly under the roller 52 installed on the liquid discharge nozzle 44 side. As means stopping the transparent plate 42 at the initial position, a stopper or the like is disposed in the Y2 direction, so that movement of the transparent plate 42 in the Y2 direction can be regulated at the initial position by making the stopper abut against an end portion of the transparent plate 42.

Laser processing is started after the transparent plate 42 is moved to the initial position described above. More specifically, the control means not depicted instructs the laser beam irradiating unit 6 to start application of the laser beam LB. When the instruction to start the application of the laser beam LB is given, the polygon mirror 91 is rotated by the motor 92, as described with reference to FIG. 7 and FIG. 8, at an appropriate rotational speed. The positions of the mirrors M constituting the polygon mirror 91 change with the rotation of the polygon mirror 91, and thereby the wafer 10 is irradiated with the laser beam LB in a dispersed state in the X-axis direction. After a predetermined mirror M is irradiated with the laser beam LB, another mirror M on a downstream side in a rotational direction R3 of the polygon mirror 91 is irradiated with the laser beam LB, and the wafer 10 is irradiated with the laser beam LB in a dispersed state as described above. Such laser processing is repeated while the laser beam LB is oscillated from the laser oscillator 82 and the polygon mirror 91 is rotated. Incidentally, the number of mirrors M constituting the polygon mirror 91, the rotational speed of the polygon mirror 91, and the like are determined as appropriate according to the workpiece.

Laser processing conditions in the laser processing apparatus 2 described above are as follows, for example.

Wavelength of the laser beam: 226 nm, 355 nm, 532 nm, 1064 nm
Average power: 10 to 100 W
Repetition frequency: 0 to 300 MHz
Pulse width: 50 fs to 1 ns
Processing feed speed: 10 to 1000 mm/s After the irradiation with the laser beam LB is started, the X-axis direction moving mechanism 76 moves the condenser 86 in the X-axis direction at a predetermined moving speed together with the X-axis direction movable plate 74. At the time of the start of the irradiation with the laser beam LB, the rollers 52 are rotated by rotating the motors 54 in the normal rotation direction R1 to start moving the transparent plate 42 in a Y1 direction indicated by an arrow Y1 slightly before the start of the irradiation with the laser beam LB. A state in which this laser processing is performed will be described with reference to FIG. 7B. Incidentally, FIG. 7B is a schematic sectional view in which a part of the transparent plate 42 and the wafer 10 are enlarged. In FIG. 7B, a direction perpendicular to a paper plane is the X-axis direction, and a left-right direction is the Y-axis direction. As described above, when ablation processing is performed by irradiating the top surface of the wafer 10 with the laser beam LB, air bubbles B occur from a position irradiated with the laser beam LB. Here, as depicted in FIG. 7B, the transparent plate 42 is linearly moved in the Y1 direction by the action of the linear-motion means 50, and the action of the transparent plate 42 accelerates the flow of the liquid W along the moving direction (the Y-axis direction) of the transparent plate 42, the moving direction being orthogonal to a direction in which processing feed is performed (the X-axis direction). Thus, the air bubbles B occurring in the liquid W at the position irradiated with the laser beam LB are removed by being carried away to the downstream side of the liquid chamber 41, that is, the liquid discharge nozzle 44 side. Hence, in the case where the wafer 10 is irradiated with the laser beam LB in a dispersed state by using the polygon mirror 91, the wafer 10 can be continuously irradiated with the laser beam LB while the air bubbles B generated by the ablation processing are avoided.

Excellent ablation processing can be performed by linearly moving the transparent plate 42 in the Y1 direction at the same time as the irradiation with the laser beam LB, as described above. Further, according to the present embodiment, even when debris is generated by the ablation processing, the debris released into the liquid W is immediately removed from a position at which the debris is generated, as with the air bubbles B described above, because the liquid W continuously flows within the liquid chamber 41 and further the linear movement of the transparent plate 42 accelerates the flow of the liquid W. The debris released into the liquid W is immediately captured by the filtration filter 46, and is therefore prevented from circulating through the liquid chamber 41 again. Incidentally, the moving speed of the transparent plate 42 in the Y1 direction is a speed such that the transparent plate 42 reaches a terminal position in a time that laser processing on one planned dividing line is performed from one end portion to the other end portion thereof, the terminal position being for example a position directly under the roller 52 on the Y2 direction side which position is reached by the end portion on the Y2 direction side of the transparent plate 42 after the transparent plate 42 moves in the Y1 direction. Hence, the longer the dimension in the Y-axis direction of the transparent plate 42, the higher the moving speed of the transparent plate 42 in the Y1 direction.

After the above-described ablation processing is performed on a predetermined planned dividing line extending in a first direction, the condenser 86 is positioned at one end portion of an adjacent unprocessed planned dividing line by moving the Y-axis direction movable member 62 in an indexing feed direction (the Y-axis direction) by the Y-axis direction moving mechanism 64, and laser processing similar to the above-described ablation processing is performed. Here, the transparent plate 42 reaches the terminal position in the Y1 direction in timing in which the laser processing on one planned dividing line is completed. Accordingly, the present embodiment performs a return operation that switches the direction of rotation of the motor 54 to the reverse rotation direction R2 and returns the transparent plate 42 to the initial position described above while the operation of positioning the condenser 86 at one end portion of the adjacent unprocessed planned dividing line is performed by moving the condenser 86 in the indexing feed direction (the Y-axis direction) after the laser processing on one planned dividing line is performed. Specifically, control is performed so as to position the transparent plate 42 at the initial position in timing in which the condenser 86 is positioned at the processing start position of the adjacent unprocessed planned dividing line. From this state, laser processing similar to the above-described laser processing, that is, the operation of performing the ablation processing while linearly moving the transparent plate 42 in the Y1 direction is performed on all of planned dividing lines extending in the first direction. After the ablation processing is performed on all of the planned dividing lines extending in the first direction, the holding table 32 is rotated by 90 degrees, and thereby laser processing similar to the above-described laser processing is performed also on unprocessed planned dividing lines orthogonal to the planned dividing lines extending in the first direction. The ablation processing can be thus performed on all of the planned dividing lines on the wafer 10. According to the present embodiment, the air bubbles occurring from the top surface of the wafer 10, the debris generated by the laser processing, and the like are immediately removed from the position irradiated with the laser beam LB and do not hinder the laser processing performed continuously, and adhesion of the debris to the devices after the processing or the like is prevented, so that a degradation in quality does not occur.

Figure 9:
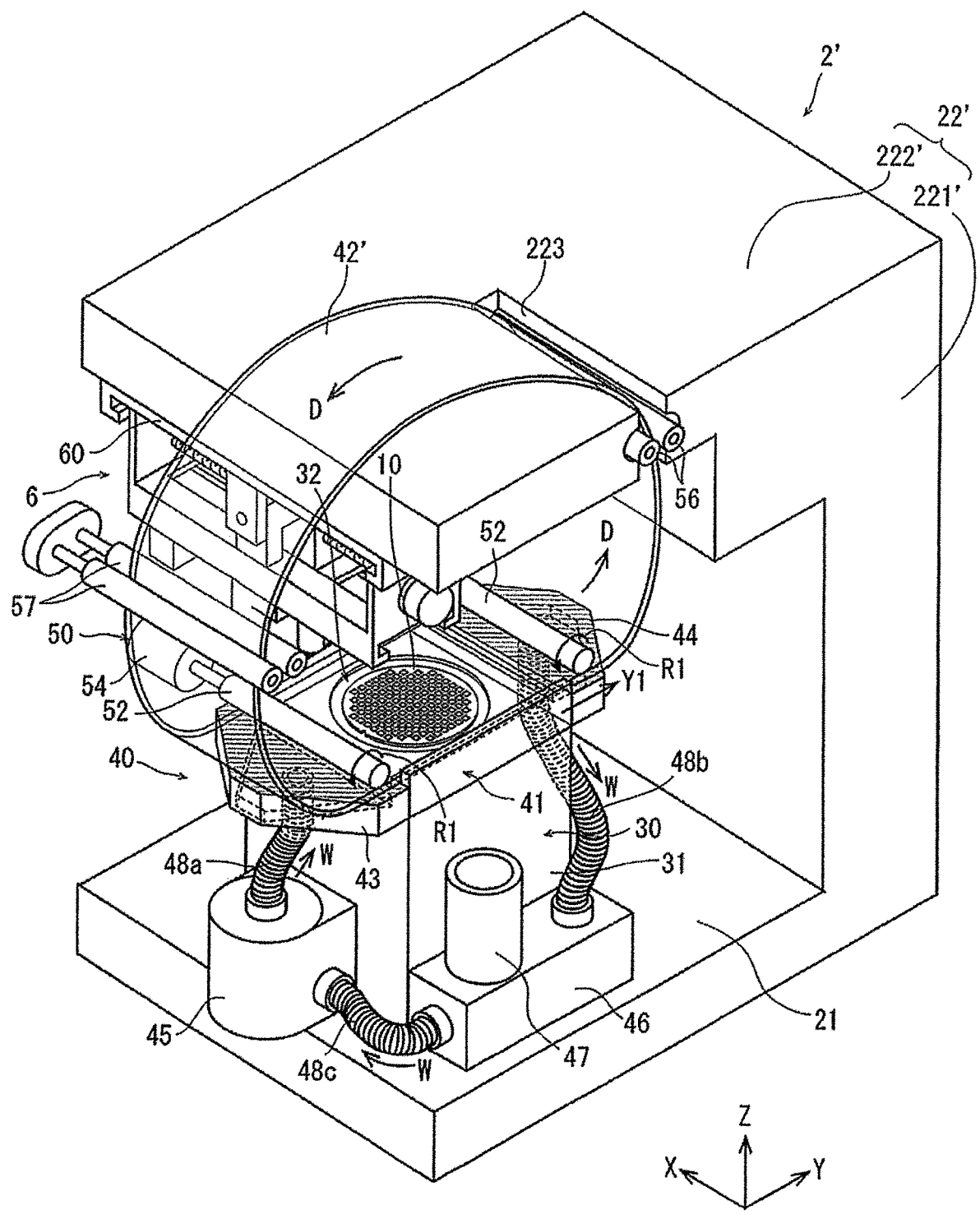
FIG. 9 is a perspective view of a laser processing apparatus according to another embodiment of the present invention.

The present invention is not limited to the foregoing embodiment, but various modifications are provided as long as the various modifications are included in the technical scope of the present invention. Another embodiment will be described in the following with reference to FIG. 9. Incidentally, a laser processing apparatus 2' according to another embodiment depicted in FIG. 9 is different from the embodiment depicted in FIG. 1 in that the laser processing apparatus 2' according to the other embodiment includes a transparent plate 42' and auxiliary rollers 56 and 57 supporting the transparent plate 42'. The laser processing apparatus 2' according to the other embodiment otherwise has a similar configuration to that of the embodiment depicted in FIG. 1. Hence, the following description will be made mainly of the above-described difference.

The laser processing apparatus 2' depicted in FIG. 9 has a roll-shaped transparent plate 42' that closes the upper part of the liquid chamber 41 in place of the transparent plate 42 of the laser processing apparatus 2 depicted in FIG. 1. This transparent plate 42' does not have end portions and is formed in a roll shape, as depicted in FIG. 9, and is thus preferably formed of a transparent thin plate made of an acrylic resin excellent in flexibility and durability. Further, a frame body 22' is formed by a vertical wall portion 221' and a horizontal wall portion 222', and a transparent plate passage 223 through which the transparent plate 42' is passed is formed in the horizontal wall portion 222'. The transparent plate passage 223 is provided with two first auxiliary rollers 56 for feeding the transparent plate 42' in a direction indicated by an arrow D in the figure while sandwiching the transparent plate 42'. Further, as depicted in FIG. 9, two second auxiliary rollers 57 for feeding the transparent plate 42' to the liquid supply mechanism 40 side while sandwiching the transparent plate 42' fed from the first auxiliary rollers 56 are provided at a position separated from an end portion of the horizontal wall portion 222' in the Y-axis direction. Incidentally, though omitted in the figure for the convenience of description, a bracket or the like that rotatably supports the second auxiliary rollers 57 is disposed and retained on the end portion of the horizontal wall portion 222'.

According to the other embodiment described above, the transparent plate 42' is formed in a roll shape. Thus, when the rollers 52 are rotated in a direction indicated by an arrow R1 by actuating the motors 54, the transparent plate 42' is linearly moved over the liquid chamber 41 in the Y1 direction, and the transparent plate 42' can be rotated in a D-direction by the first auxiliary rollers 56 and the second auxiliary rollers 57. This eliminates a need for the return operation of returning the transparent plate 42 to the initial position by rotating the motors 54 in the reverse rotation direction R2 as in the embodiment depicted in FIG. 1, and makes it possible to perform the laser processing on all of the planned dividing lines on the wafer 10 while continuing linearly moving the transparent plate 42' over the liquid chamber 41 in the direction indicated by Y1. Further, in the present embodiment, because the linear movement of the transparent plate 42' in the Y1 direction is performed continuously, a speed at which the transparent plate 42' is moved in the Y1 direction can be increased, and the air bubbles B, the debris, and the like can be removed more effectively, as compared with the embodiment depicted in FIG. 1.

The foregoing embodiments present an example in which the laser beam LB emitted from the laser oscillator 82 is dispersed by the polygon mirror 91 and guided to the condensing lens 86b. However, without limitation to this, a fixedly installed reflecting mirror may be used in place of the polygon mirror 91. Further, the foregoing embodiments present an example in which the laser processing performed on the wafer 10 is ablation processing. However, this does not preclude application to processing that forms a modified layer within a workpiece (for example the laser processing described in Japanese Patent No. 3408805) or processing that forms a so-called shield tunnel (for example the laser processing described in Japanese Patent Laid-Open No. 2014-221483).

The present invention is not limited to the details of the above described preferred embodiments. The scope of the invention is defined by the appended claims and all changes and modifications as fall within the equivalence of the scope of the claims are therefore to be embraced by the invention.

What is claimed is:

1. A laser processing apparatus comprising:
   a holding unit including a holding table configured to hold a plate-shaped workpiece;
   a laser beam irradiating unit configured to process the workpiece held on the holding table by irradiating the workpiece with a laser beam; and
   a liquid supply mechanism disposed on an upper portion of the holding unit;
   the liquid supply mechanism including a liquid chamber having a transparent plate positioned such that a gap is formed between the transparent plate and a top surface of the workpiece held on the holding table, a linear-motion mechanism configured to linearly move the transparent plate over the liquid chamber, a liquid supply nozzle configured to supply a liquid from one side of the liquid chamber to the gap, and a liquid discharge nozzle configured to discharge the liquid from another side of the liquid chamber, and
   the laser beam irradiating unit including a laser oscillator configured to emit the laser beam and a condenser configured to condense the laser beam emitted from the laser oscillator and irradiate the workpiece held on the holding table with the laser beam through the transparent plate and the liquid supplied to the gap.

2. The laser processing apparatus according to claim 1, wherein
   the laser beam irradiating unit further includes dispersing means dispersing the laser beam emitted from the laser oscillator.

* * * * *